United States Patent
Wang et al.

(10) Patent No.: US 11,424,344 B2
(45) Date of Patent: Aug. 23, 2022

(54) TRENCH MOSFET AND METHOD FOR MANUFACTURING THE SAME

(71) Applicant: Hangzhou Silicon-Magic Semiconductor Technology Co., Ltd., Hangzhou (CN)

(72) Inventors: Jiakun Wang, Hangzhou (CN); Bing Wu, Hangzhou (CN)

(73) Assignee: HANGZHOU SILICON-MAGIC SEMICONDUCTOR TECHNOLOGY CO., LTD., Hangzhou (CN)

(*) Notice: Subject to any disclaimer, the term of this patent is extended or adjusted under 35 U.S.C. 154(b) by 0 days.

(21) Appl. No.: 17/091,225

(22) Filed: Nov. 6, 2020

(65) Prior Publication Data

US 2021/0159324 A1 May 27, 2021

(30) Foreign Application Priority Data

Nov. 22, 2019 (CN) ......................... 201911156668.4

(51) Int. Cl.
| | | |
|---|---|---|
| *H01L 29/423* | (2006.01) | |
| *H01L 29/66* | (2006.01) | |
| *H01L 21/308* | (2006.01) | |
| *H01L 29/78* | (2006.01) | |

(52) U.S. Cl.
CPC .... *H01L 29/66734* (2013.01); *H01L 21/3081* (2013.01); *H01L 21/3088* (2013.01); *H01L 29/4236* (2013.01); *H01L 29/7813* (2013.01)

(58) Field of Classification Search
CPC ... H01L 29/42; H01L 29/423; H01L 29/4236; H01L 29/66; H01L 29/667; H01L 29/6673; H01L 29/66734; H01L 29/78; H01L 29/781; H01L 29/7813; H01L 21/30; H01L 21/308; H01L 21/3081; H01L 21/3088
USPC ......................................................... 257/330
See application file for complete search history.

(56) References Cited

U.S. PATENT DOCUMENTS

| | | | |
|---|---|---|---|
| 6,921,697 B2 | 7/2005 | Darwish et al. | |
| 7,772,668 B2 | 8/2010 | Pan | |
| 8,497,549 B2* | 7/2013 | Madson | H01L 29/7813 257/330 |

(Continued)

FOREIGN PATENT DOCUMENTS

CN 108039369 A 5/2018

*Primary Examiner* — Monica D Harrison
(74) *Attorney, Agent, or Firm* — Alston & Bird LLP

(57) ABSTRACT

A method of manufacturing a trench MOSFET can include: forming a trench extending from an upper surface of a semiconductor base layer to internal portion of the semiconductor base layer; forming a first insulating layer covering sidewall and bottom surfaces of the trench and the upper surface of the semiconductor base layer; forming a shield conductor filling a lower portion of the trench, where the first insulating layer separates the shield conductor from the semiconductor base layer; forming a second insulating layer covering a top surface of the shield conductor, where the first insulating layer separates the second insulating layer from the semiconductor base layer, and the first and second insulating layers conformally form a dielectric layer; and removing the dielectric layer located on the upper surface of the semiconductor base layer and located on the upper sidewall surface of the trench.

19 Claims, 9 Drawing Sheets

(56) References Cited

U.S. PATENT DOCUMENTS

| | | |
|---|---|---|
| 8,829,641 B2 | 9/2014 | Marchant |
| 2009/0321817 A1* | 12/2009 | Hunt .................. H01L 29/7813 |
| | | 257/330 |
| 2015/0061002 A1 | 3/2015 | Tong |
| 2015/0118810 A1 | 4/2015 | Bobde et al. |
| 2016/0064478 A1 | 3/2016 | Sun et al. |

* cited by examiner

TRENCH MOSFET AND METHOD FOR MANUFACTURING THE SAME

RELATED APPLICATIONS

This application claims the benefit of Chinese Patent Application No. 201911156668.4, filed on Nov. 22, 2019, which is incorporated herein by reference in its entirety.

FIELD OF THE INVENTION

The present invention generally relates to the field of power electronics, and more particularly to zero-voltage-switching control circuits, and associated control methods and switching power supplies.

BACKGROUND

A switched-mode power supply (SMPS), or a "switching" power supply, can include a power stage circuit and a control circuit. When there is an input voltage, the control circuit can consider internal parameters and external load changes, and may regulate the on/off times of the switch system in the power stage circuit. Switching power supplies have a wide variety of applications in modern electronics. For example, switching power supplies can be used to drive light-emitting diode (LED) loads.

DETAILED DESCRIPTION

Figure 1:
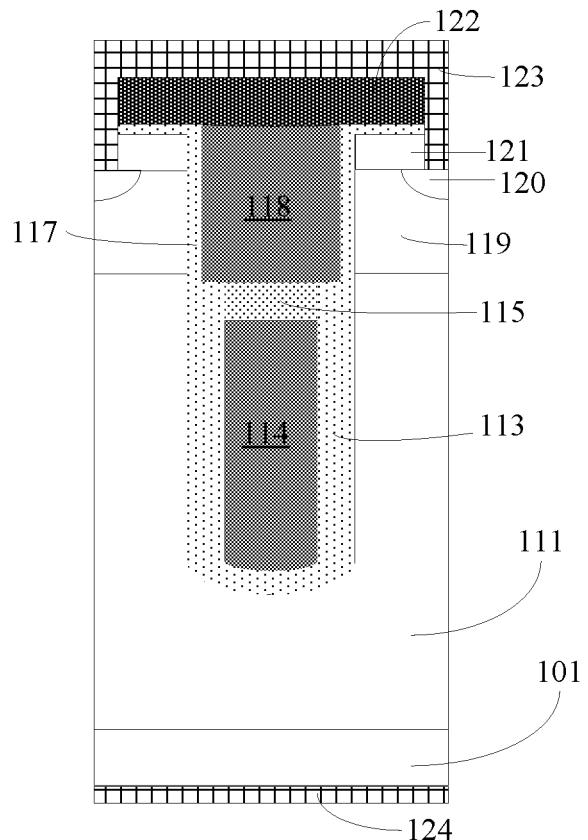
FIG. 1 is cross-sectional view of an example trench MOSFET, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Metal-oxide-semiconductor field-effect transistors (MOSFETs) have been widely used as power semiconductor devices, such as switches of power converters. A variety of different device structures and methods have been used by the semiconductor industry used to form MOSFETs. In a shielded gate trench MOSFET, as compared to a typical MOSFET, the shield electrode may reduce the gate-drain capacitance and increase the cut-off voltage of the transistor. The gate electrode and the shield electrode may be insulated from each other by an inter-electrode dielectric (IED). The IED may have sufficient mass and thickness to support the potential difference between the shield electrode and the gate electrode. In addition, the interface well charge and dielectric well charge at the interface between the shield electrode and the IED layer and in the IED layer are primarily related to the method of forming the IED layer.

A high quality IED having sufficient strength and sufficient reliability may provide the required electrical characteristics for a shielded gate trench MOSFET. However, the process of forming the IED layer between the gate electrode and the shield electrode can be a relatively difficult and costly operation. Therefore, a method for forming shielded gate trench MOSFETs is needed to meet the demand for high quality IEDs and to ensure the performance of shielded gate trench MOSFETs while reducing production costs.

In one embodiment, a method of manufacturing a trench MOSFET can include: (i) forming a trench extending from an upper surface of a semiconductor base layer to internal portion of the semiconductor base layer; (ii) forming a first insulating layer covering sidewall and bottom surfaces of the trench and the upper surface of the semiconductor base layer; (iii) forming a shield conductor filling a lower portion of the trench, where the first insulating layer separates the shield conductor from the semiconductor base layer; (iv) forming a second insulating layer covering a top surface of the shield conductor, where the first insulating layer separates the second insulating layer from the semiconductor base layer, and the first and second insulating layers conformally form a dielectric layer; (v) removing the dielectric layer located on the upper surface of the semiconductor base layer and located on the upper sidewall surface of the trench, where the upper surface of the remaining dielectric layer is higher than the upper surface of the shielding conductor; (vi) forming a gate dielectric layer and a gate conductor filling an upper portion of the trench, where the gate dielectric layer is located on upper sidewall surface of the trench and separates the gate conductor from the semiconductor base layer; and (vii) forming a body region, a source region, and a drain electrode.

Unless the context clearly indicates otherwise, each part of the semiconductor device can be made of material(s) well known to one skilled person in the art. The semiconductor material includes for example group III-V semiconductor, such as GaAs, InP, GaN, and SiC, and group IV semiconductor, such as Si, and Ge. A gate conductor may be made of any conductive material, such as metal, doped polysilicon, and a stack of metal and doped polysilicon, among others. For example, the gate conductor may be made of one selected from a group consisting of TaC, TiN, TaSiN, HfSiN, TiSiN, TiCN, TaAlC, TiAlN, TaN, PtSix, Ni$_3$Si, Pt, Ru, W, and their combinations. A gate dielectric may be made of SiO2 or any material having dielectric constant larger than that of SiO2. For example, the gate dielectric may be made of one selected from a group consisting of oxides, nitrides, oxynitrides, silicates, aluminates, and titanates. Moreover, the gate dielectric can be made of those developed in the future, besides the above known materials.

Referring now to FIG. 1, shown is cross-sectional view of an example trench MOSFET, in accordance with embodiments of the present invention. Semiconductor base layer can include semiconductor substrate 101 and epitaxial semiconductor layer 111 on semiconductor substrate 101. For example, semiconductor substrate 101 can include silicon, and may be a first doped type. The "first" doping type is one of N type and P type, and a "second" doping type is the other one of the N type and P type. In order to form an N-type epitaxial semiconductor layer or region, an N-type dopant (e.g., P, As) can be doped in the epitaxial semiconductor layer or region. In order to form a P-type epitaxial semiconductor layer or region, a P-type dopant (e.g., B) can be doped in the epitaxial semiconductor layer and region. For example, semiconductor substrate 101 is N-type doped.

Epitaxial semiconductor layer 111 of the first doping type may be on a surface of semiconductor substrate 101 opposite to that of drain electrode 124 (e.g., the first surface of semiconductor substrate 101). For example, Epitaxial semiconductor layer 111 can include silicon. Epitaxial semiconductor layer 111 may be a lightly doped layer relative to semiconductor substrate 101. The second surface of semiconductor substrate 101 can be thinned by a thinning process, and drain electrode 124 may be formed on the second surface of semiconductor substrate 101. In some embodiments, a buffer layer may be further provided between semiconductor substrate 101 and epitaxial semiconductor layer 111, and the doping type of the buffer layer is the same as that of the semiconductor substrate to reduce the interface instability between the semiconductor substrate and the epitaxial semiconductor layer due to the defect of the semiconductor substrate.

A trench can extend from an upper surface of epitaxial semiconductor layer 111 into its interior portion, and may end inside epitaxial semiconductor layer 111. Insulating layer 113 and shield conductor 114 can be formed in the lower portion of the trench. Insulating layer 113 may be located on a lower sidewall surface and a bottom surface of the trench, and insulating layer 113 can separate shield conductor 114 from epitaxial semiconductor layer 111. Insulating layer 115 may be formed on a top surface of shield conductor 114. Insulating layer 115 and insulating layer 113 conformally form a dielectric layer, and both sides of insulating layer 115 are surrounded by insulating layer 113. That is, the insulating layer 113 can separate insulating layer 115 from epitaxial semiconductor layer 111, where the dielectric layer on shield conductor 114 is configured as an inter-electrode dielectric. Gate dielectric layer 117 and gate conductor 118 can be filled in an upper portion of the trench, gate dielectric layer 117 may be located on the upper sidewall surface of the trench, and gate dielectric layer 117 can separate gate conductor 118 from epitaxial semiconductor layer 111. The inter-electrode dielectric can shield and separate shield conductor 114 and gate conductor 118. For example, insulating layers 113 can include an oxide or a nitride (e.g., silicon oxide, silicon nitride, etc.), insulating layers 115 can include an oxide (e.g., silicon oxide, etc.), and shield conductor 114 and gate conductor 118 can include polysilicon.

Body region 119 of the second doping type may be formed in an upper region of epitaxial semiconductor layer 111 adjacent to the trench. For example, the junction depth of body region 119 does not exceed the depth of gate conductor 118 in the trench. Source region 121 of the first doping type can be formed in body region 119. Body contact region 120 of the second doping type may be formed in body region 119. Here, the second doping type is opposite to the first doping type, where the first doping type is one of N type and P type, and the second doping type is the other one of the N type and P type. After source region 121 is formed, an interlayer dielectric layer 122 may be formed on source region 121 and gate conductor 118. Conductive channel that penetrates interlayer dielectric layer 122 and source region 121 to reach body contact region 120 may be formed adjacent to source region 121. Source electrode 123 can be formed on interlayer dielectric layer 122, and source electrode 123 may be connected to body contact region 120 via conductive channel. For example, interlayer dielectric layer 122 can be an oxide layer having a specific thickness (e.g., silicon oxide).

Figure 2A:
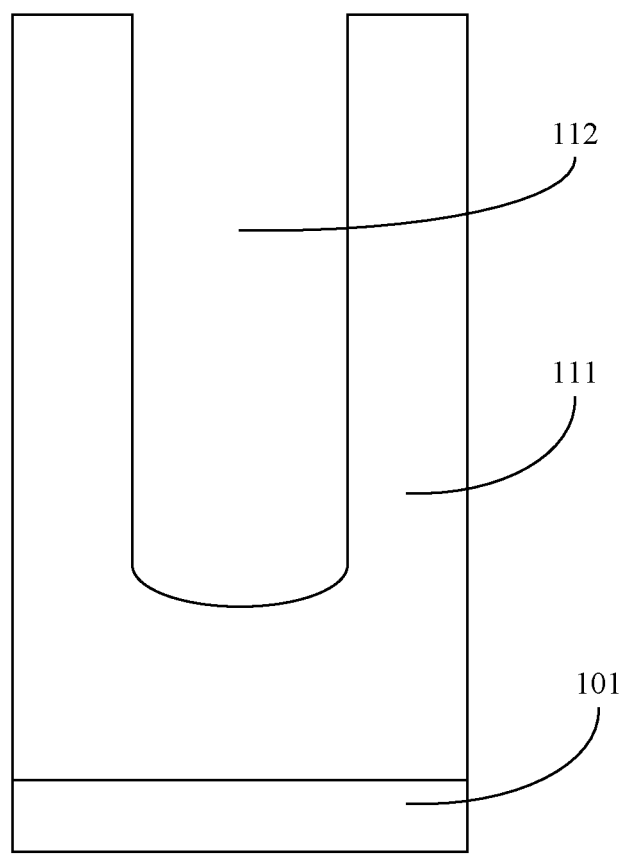
FIGS. 2A to 2H are cross-sectional views of formation steps of an example method of manufacturing a trench MOSFET, in accordance with embodiments of the present invention.

Referring now to FIGS. 2A-2H, shown are cross-sectional views of formation steps of an example method of manufacturing a trench MOSFET, in accordance with embodiments of the present invention. In FIG. 2A, semiconductor base layer includes semiconductor substrate 101 and epitaxial semiconductor layer 111 formed on semiconductor substrate 101. An oxide layer may be formed on epitaxial semiconductor layer 111, and a photoresist layer can be formed on the oxide layer. Then, an etching process may be performed, which can be dry etching (e.g., ion milling etching, plasma etching, reactive ion etching, laser ablation, etc.), or selective wet etching using an etching solution. A process of etching downward from the opening of the photoresist mask can be performed to form an opening of the oxide layer, whereby the oxide layer is patterned to be configured as a first hard mask. The etching can be stopped on the first surface of epitaxial semiconductor layer 111 according to the selected etching process. After the first hard mask is formed, the photoresist layer may be removed, such as by dissolution in a solvent or ashing process.

Epitaxial semiconductor layer 111 can be further etched by the above-described etching process using the first hard mask to form a trench in epitaxial semiconductor layer 111. The trench may extend from the upper surface of epitaxial semiconductor layer 111 into internal portion of epitaxial semiconductor layer 111. For example, the depth of the trench can be controlled by controlling the etching time. In FIG. 2A, the trench may end inside epitaxial semiconductor layer 111. After the trench is formed, the first hard mask can be removed relative to the epitaxial semiconductor layer, such as by a selective etchant.

Figure 2B:
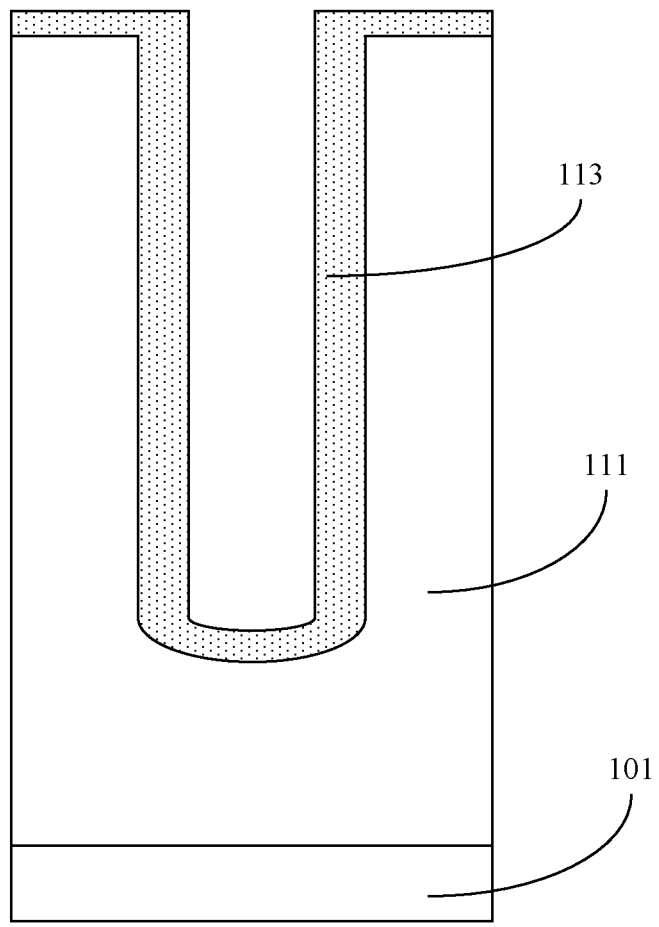

As shown in FIG. 2B, insulating layer 113 may be formed along the internal surface of the trench and the upper surface of epitaxial semiconductor layer 111, such as by a thermal oxidation process or low pressure chemical vapor deposition process. Insulating layer 113 may cover the bottom surface and sidewall surfaces of the trench and the upper surface of epitaxial semiconductor layer. Insulating layer 113 can include of oxide or nitride (e.g., silicon oxide, silicon nitride, etc.)

Figure 2C:
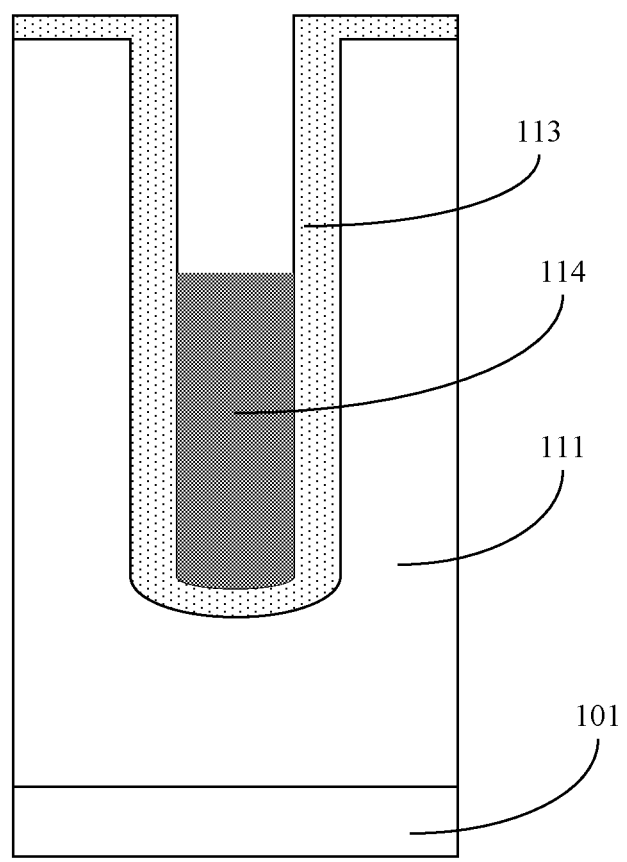

As shown in FIG. 2C, Shield conductor can be formed to fill up the trench and to cover the upper surface of epitaxial semiconductor layer 111, such as by a low pressure chemical vapor deposition process. Insulating layer 113 may separate shield conductor from epitaxial semiconductor layer 111. Shield conductor may be polished by a chemical mechanical polishing process (CMP). Shield conductor can be selectively etched back relative to insulating layer 113 such that shield conductor on the upper surface of epitaxial semiconductor layer 111 and occupying an upper portion of the trench may be removed, the remaining shielded conductor in the lower portion of the trench may be shielded conductor 114 in FIG. 2C. For example, the etching back can be performed by a dry etching process. Shield conductor 114 can include doped polysilicon.

Figure 2D:
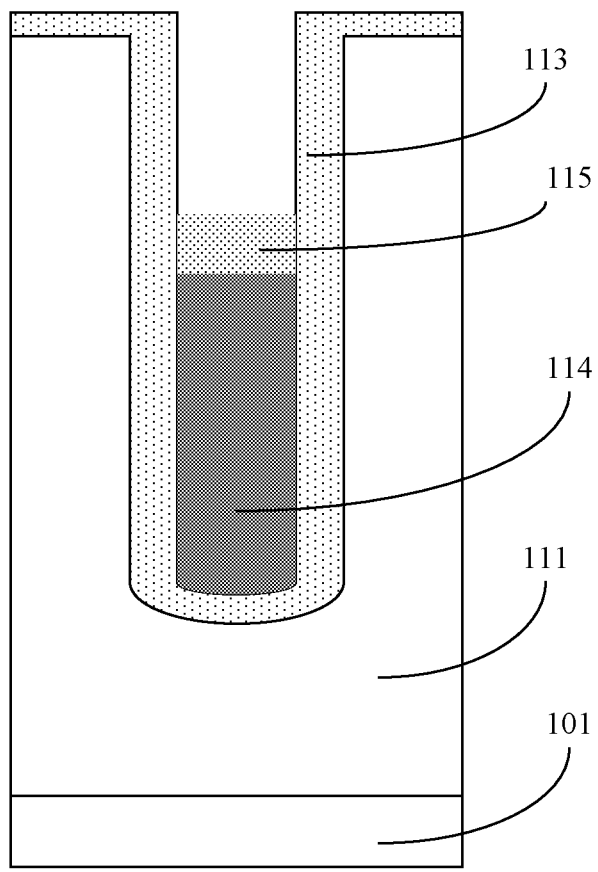

As shown in FIG. 2D, insulating layer 115 is formed on the top surface of shielding conductor 114 by thermal oxidation process. Both sides of insulating layer 115 are surrounded by insulating layer 113; that is, insulating layer 113 separates insulating layer 115 from epitaxial semiconductor layer 111. Insulating layers 113 and 115 may conformally form a dielectric layer. Insulating layer 115 can include oxide (e.g., silicon oxide).

Figure 2E:
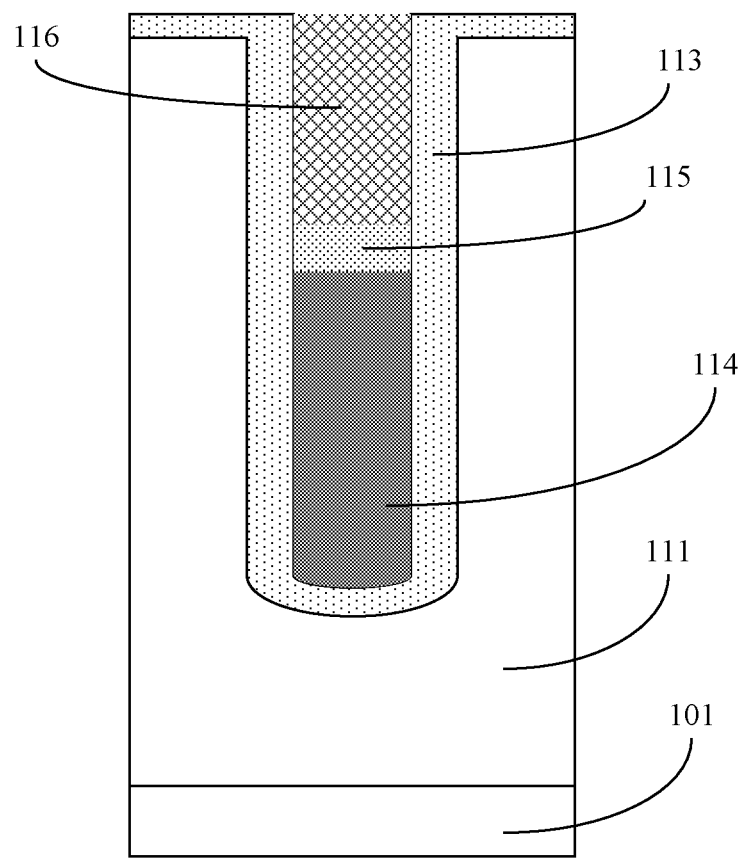

As shown in FIG. 2E, second hard mask 116 may be formed on insulating layer 115. For example, the second hard mask includes a first part located in the trench and a second part located on the upper surface of epitaxial semiconductor layer 111. Etching or chemical mechanical planarization removes the second part of the second hard mask so that the dielectric layer is exposed, as shown in FIG. 2E. Insulating layer 113 (the dielectric layer) may separate second hard mask 116 from the epitaxial semiconductor layer 111. Insulating layer 113 (the dielectric layer) may have a high etching selectivity ratio relative to second hard mask 116. That is, under the same etching conditions, the dielectric layer may have a relatively fast etching rate with the second hard mask. Second hard mask 116 can include, e.g., photoresist, silicon, or polycrystalline semiconductor.

Figure 2F:
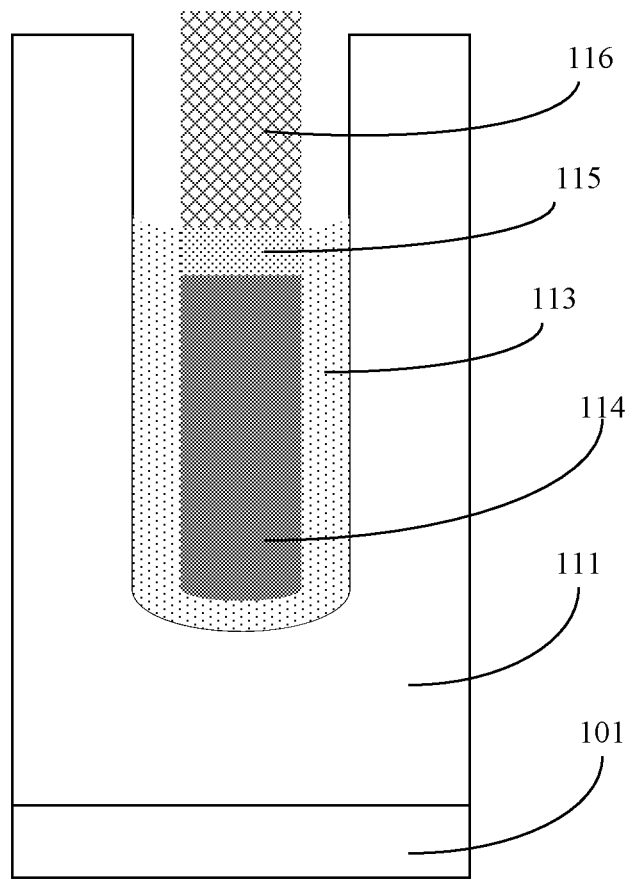

As shown in FIG. 2F, the dielectric layer can be etched selectively relative to the second hard mask 116, and the dielectric layer located on the upper surface of epitaxial semiconductor layer 111 and the upper sidewall surface of the trench is removed, such that the upper surface of the remaining dielectric layer is higher than the top surface of shielding conductor 114.

Figure 2G:
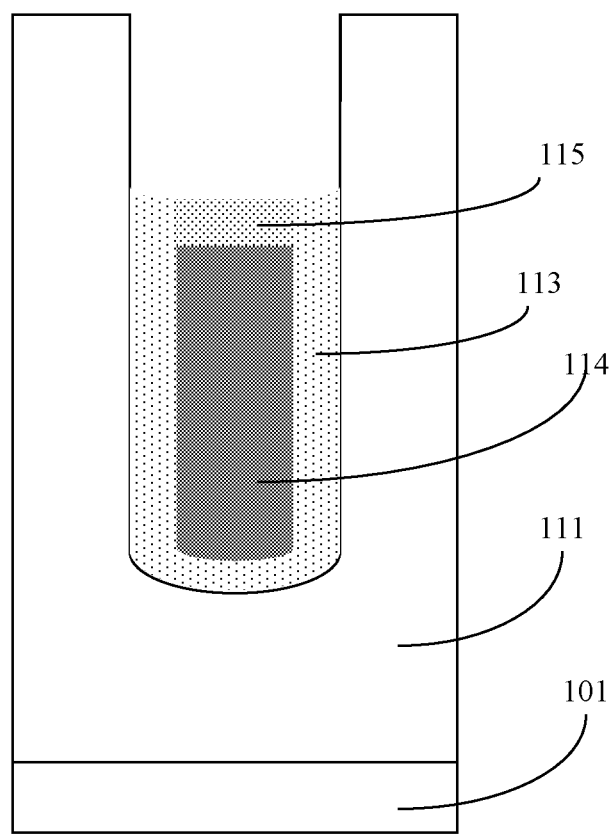

As shown in FIG. 2G, second hard mask 116 may be removed. The method for removing second hard mask 116 can be determined according to the selected second hard mask material. For example, second hard mask 116 may include photoresist, which can be removed by a plasma stripper. The second hard mask 116 may include silicon material or polycrystalline semiconductor material, which can be removed by etching back. After the second hard mask is removed, a small amount of the dielectric layer is slightly removed by spraying or soaking with an acid solution, so that the upper surface of the dielectric layer is smoother. The acidic solution can be include hydrofluoric acid (HF) or hydrofluoric acid buffered by ammonium fluoride. Where the remaining the dielectric layer on the shield conductor is configured as an inter-electrode dielectric.

Figure 2H:
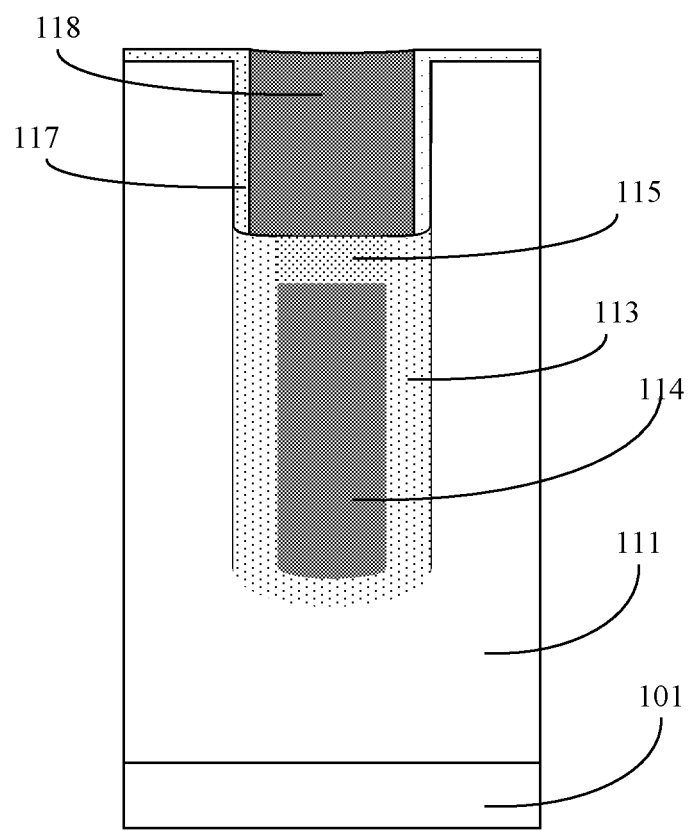

As shown in FIG. 2H, an oxide layer (e.g., gate dielectric layer 117) can be formed on sidewall surface of the upper portion of the trench and the upper surface of epitaxial semiconductor layer 111, e.g., by a thermal oxidation process, such that sidewalls the trench are covered by gate dielectric layer 117. A thermal oxidation process is generally used to react silicon with gases containing oxides, such as water vapor and oxygen, at high temperatures, and to produce a dense layer of silicon dioxide ($SiO_2$) film on the surface of silicon wafer.

Further, polysilicon can fill up the trench covered with gate dielectric layer 117, such as by low pressure chemical vapor deposition, in order to form a gate conductor 118. Gate conductor 118 can include a first portion inside the trench and a second portion on the upper surface of epitaxial semiconductor layer. The second portion of gate conductor on the upper surface of epitaxial semiconductor layer may be removed by etching back or chemical mechanical planarization process, such that gate conductor 118 is located inside the trench and the top surface of gate conductor 118 may not be higher than the opening of the trench. Alternatively, the conductor layer of gate conductor 118 may be selectively removed relative to epitaxial semiconductor layer 111, and the conductor layer can be etched back such that the top surface of gate conductor 118 is not higher than the upper surface of epitaxial semiconductor layer 111. The inter-electrode dielectric shields and insulates shield conductor 114 and gate conductor 118, and the inter-electrode dielectric has a certain mass and thickness to support the potential difference that may exist between shield conductor 114 and gate conductor 118. For example, the thickness of the inter-electrode dielectric can be selected from 800 Å to 1500 Å.

As shown in FIG. 1, a first ion implantation and driving technique may be performed to form body region 119 of a second doping type in the upper region of epitaxial semiconductor layer 111 adjacent to the trench. Further, a second ion implantation can be performed to form source region 121 of the first doping type in body region 119. The second doping type may be opposite to the first doping type. The desired doping depth and doping concentration can be achieved by controlling the parameters of the ion implantation, such as the implantation energy and implantation dose. The depth of body region 119 does not exceed the extending depth of gate conductor 118 in the trench. The lateral extension of body region 119 and source region 121 can be controlled using an additional photoresist mask. For example, body region 119 and source region 121 may be adjacent to the trench, and respectively separated into two portions by gate conductor 118 and gate dielectric 117.

In addition, interlayer dielectric layer 122 located on source region 121 can be formed, such as by the above-described deposition process, and chemical mechanical planarization may further be performed as necessary in order to obtain a flat surface. Interlayer dielectric layer 122 can cover the top surface of source region 121 and gate conductor 118. The portion of the gate dielectric layer located on the upper surface of the epitaxial semiconductor layer can be removed by etching process after the source region is formed, or it can be selected not to be removed, and is conformal to the interlayer dielectric layer 122. Body contact region 120 of the second doping type may be formed in body region 119, such as by the above-described etching process and an ion implantation process. A conductive channel penetrating interlayer dielectric layer 122 and source region 121 reaching body contact region 120 may be formed, such as by the above-described etching process. Source electrode 123 can be formed on interlayer dielectric layer 122, and source electrode 123 may connect to body contact region 120 via the conductive channel.

Drain electrode 124 can be formed on the second surface of semiconductor substrate 101 thinned by a thinning technique, such as by the above-described deposition process. In the above example, conductive channel, source electrode 123, gate conductor 118, shield conductor 114, and drain electrode 124, may be formed by a conductive material, such as a metal material (e.g., an aluminum alloy, copper, etc.).

In the method of manufacturing the trench MOSFET in certain embodiments, in the step of forming insulating layer 115, insulating layer 113 on the upper sidewall surface of the trench may not be etched and removed, but insulating layer 115 can be formed on the top surface of the shielded conductor through a thermal oxidation process after forming the shielded conductor, the first insulating layer and the second insulating layer conformally to form a dielectric layer, and then the hard mask filled in trench and on the second insulating layer is used to etch the dielectric layer on the upper sidewall surface of the trench, so that the upper surface of the remaining dielectric layer is higher than the top surface of the shielding conductor, and finally the hard mask may be removed. In addition, in the process of growing the second insulating layer with thermal oxidation process, because of the existence of the first insulating layer, the silicon in the epitaxial semiconductor layer may not be consumed (the consumption is less and can effectively be ignored), such that the width of the trench becomes not larger. In addition, the thickness of the second insulating layer formed by thermal oxidation has advantages such as uniformity and stability, such that it has sufficient quality and thickness to support the potential difference that may exist between the shielding conductor and the gate conductor.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of manufacturing a trench MOSFET, the method comprising:
   a) forming a trench extending from an upper surface of a semiconductor base layer to internal portion of the semiconductor base layer;
   b) forming a first insulating layer covering sidewall and bottom surfaces of the trench and an upper surface of the semiconductor base layer;
   c) forming a shield conductor filling a lower portion of the trench, wherein the first insulating layer separates the shield conductor from the semiconductor base layer;
   d) forming a second insulating layer covering a top surface of the shield conductor, wherein the first insulating layer remains covering upper sidewalls of the trench and the upper surface of the semiconductor base layer prior to forming the second insulating layer, wherein the first insulating layer separates the second insulating layer from the semiconductor base layer, and the first and second insulating layers conformally form a dielectric layer;
   e) removing the dielectric layer located on the upper surface of the semiconductor base layer and located on the upper sidewall surface of the trench, wherein the upper surface of the remaining dielectric layer is higher than the upper surface of the shielding conductor;
   f) forming a gate dielectric layer and a gate conductor filling an upper portion of the trench, wherein the gate dielectric layer is located on upper sidewall surface of the trench and separates the gate conductor from the semiconductor base layer; and
   g) forming a body region, a source region, and a drain electrode;
      wherein a top surface of the gate conductor is higher than a top surface of the source region.

2. The method of claim 1, wherein the removing the dielectric layer comprises:
   a) forming a hard mask filling the upper portion of the trench;
   b) removing the dielectric layer located on the upper surface of the semiconductor base layer and located on the upper sidewall surface of the trench by etching process using the hard mask;
   c) removing the hard mask; and
   d) wherein the dielectric layer between the shield conductor and the gate conductor is configured as an inter-electrode dielectric for shielding the shield conductor and the gate conductor.

3. The method of claim 2, wherein the forming the hard mask comprises:
   a) depositing the hard mask comprising a first portion in the trench and a second portion on the upper surface of the semiconductor base layer; and
   b) removing the second portion of the hard mask by etching back process or chemical mechanical planarization process to expose a top surface of the dielectric layer.

4. The method of claim 2, wherein after the removing the hard mask, the method further comprises using an acid solution to remove part of the inter-electrode dielectric, such that the upper surface of the inter-electrode dielectric is smooth.

5. The method of claim 2, wherein the dielectric layer has a high etching selectivity ratio relative to the hard mask.

6. The method of claim 2, wherein the hard mask is configured as one of photoresist, silicon, or polysilicon.

7. The method of claim 1, wherein the second insulating layer comprises an oxide layer formed by thermal oxidation process.

8. The method of claim 3, wherein the etching back process comprises a dry etching process.

9. The method of claim 1, wherein the first insulating layer comprises an oxide layer formed by thermal oxidation process or low pressure chemical vapor deposition process.

10. The method of claim 1, the gate dielectric layer comprises an oxide layer formed by thermal oxidation process.

11. The method of claim 1, wherein each of the shield conductor and the gate conductor comprises polysilicon layer formed by low pressure chemical vapor deposition process.

12. The method of claim 1, further comprising:
    a) forming the body region having a second doping type in an upper region of the semiconductor base layer adjacent to the trench, wherein the second doping type is opposite to the first doping type;
    b) forming the source region having the first doping type in the body region; and
    c) forming the drain electrode on a second surface of the semiconductor base layer, the second surface and the upper surface of the semiconductor base layer are opposite to each other.

13. The method of claim 12, wherein after the forming the source region, the method further comprises:
    a) forming an interlayer dielectric layer on the source region and the gate conductor; and
    b) forming a source electrode on the interlayer dielectric layer.

14. The method of claim 13, wherein before the forming the source electrode, the method further comprises:
    a) forming a body contact region having the second doping type in the body region; and
    b) forming a conductive channel penetrating the interlayer dielectric layer and the source region to the body contact region, wherein the source electrode is connected to the body contact region via the conductive channel.

15. The method of claim 1, wherein the semiconductor base layer comprises a semiconductor substrate and an epitaxial semiconductor layer on the semiconductor substrate, wherein the trench is located in the epitaxial semiconductor layer.

16. The method of claim 1, wherein the first doping type is one of N type and P type, and the second doping type is the other one of N type and P type.

17. A trench MOSFET manufactured by the method of claim 1.

18. The method of claim 1, wherein the source region is above the drain electrode.

19. The method of claim 1, wherein the gate conductor is above the drain electrode.

\* \* \* \* \*